(12) United States Patent
Liu et al.

(10) Patent No.: US 10,804,341 B2
(45) Date of Patent: Oct. 13, 2020

(54) ARRAY SUBSTRATE, DISPLAY PANEL AND OPERATING METHOD THEREOF

(71) Applicant: BOE TECHNOLOGY GROUP CO., LTD., Beijing (CN)

(72) Inventors: Yingming Liu, Beijing (CN); Xue Dong, Beijing (CN); Haisheng Wang, Beijing (CN); Xiaochuan Chen, Beijing (CN); Xiaoliang Ding, Beijing (CN); Lei Wang, Beijing (CN); Changfeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/401,749

(22) Filed: May 2, 2019

(65) Prior Publication Data

US 2020/0091253 A1    Mar. 19, 2020

(30) Foreign Application Priority Data

Sep. 14, 2018    (CN) .......................... 2018 1 1075578

(51) Int. Cl.
*H01L 27/32* (2006.01)
*H01L 29/66* (2006.01)
(Continued)

(52) U.S. Cl.
CPC ........ *H01L 27/3234* (2013.01); *G06K 9/0004* (2013.01); *H01L 27/14605* (2013.01); *H01L 27/14612* (2013.01); *H01L 27/14636* (2013.01); *H01L 27/14678* (2013.01); *H01L 27/3225* (2013.01); *H01L 27/3262* (2013.01);
(Continued)

(58) Field of Classification Search
CPC ............. H01L 27/3234; H01L 27/3272; H01L 27/3276; H01L 27/14636; H01L 29/66992; H01L 27/3225; H01L 27/14678; H01L 27/14605; H01L 31/105; H01L 27/3262; H01L 27/14612; G06K 9/0004
See application file for complete search history.

(56) References Cited

U.S. PATENT DOCUMENTS

| | | | |
|---|---|---|---|
| 2005/0103980 A1* | 5/2005 | Schultz | G11C 11/22 250/208.1 |
| 2015/0243712 A1 | 8/2015 | Wang et al. | |
| 2018/0211079 A1 | 7/2018 | Liu et al. | |

FOREIGN PATENT DOCUMENTS

| | | |
|---|---|---|
| CN | 106355136 A | 1/2017 |
| CN | 107301407 A | 10/2017 |

OTHER PUBLICATIONS

First Chinese Office Action issued by the Chinese Patent Office in corresponding Chinese Application No. 201811075578.8 dated Jun. 23, 2020.

* cited by examiner

*Primary Examiner* — Kyoung Lee
(74) *Attorney, Agent, or Firm* — Dilworth & Barrese, LLP.; Michael J. Musella, Esq.

(57) ABSTRACT

An array substrate, a display panel and an operating method thereof are disclosed. The array substrate includes a base substrate; an imaging array disposed on the substrate, wherein the imaging array includes a photoelectric detection circuit and a temperature detection circuit, the photoelectric detection circuit includes a photosensitive sensor configured to detect light for imaging, and the temperature detection circuit includes a temperature sensitive sensor configured to detect temperature.

20 Claims, 5 Drawing Sheets

(51) Int. Cl.
*G06K 9/00* (2006.01)
*H01L 27/146* (2006.01)
*H01L 31/105* (2006.01)
(52) U.S. Cl.
CPC ...... *H01L 27/3272* (2013.01); *H01L 27/3276* (2013.01); *H01L 29/66992* (2013.01); *H01L 31/105* (2013.01)

ARRAY SUBSTRATE, DISPLAY PANEL AND OPERATING METHOD THEREOF

TECHNICAL FIELD

The embodiments of the disclosure relate to an array substrate, a display panel and an operating method thereof.

BACKGROUND

With the development of technology, functions of the display device are increasingly rich. For example, while realizing the display function, it may also has fingerprint recognition, iris recognition, face recognition and other functions. Fingerprint recognition, iris recognition, face recognition and other functions usually use photoelectric detection technology, that is, the display device emits light, and a corresponding image is obtained by detecting the light reflected by the user's fingers, iris, face contour and other parts, so as to perform recognition and judge.

In order to realize photoelectric detection technology, a photoelectric detection circuit is needed. For example, the photoelectric detection circuit is usually integrated on an array substrate of a display device, which is configured to detect light irradiated onto the array substrate from outside of the array substrate for imaging, so as to cooperate with other components in the display device to realize corresponding functions.

SUMMARY

At least one embodiment of the present disclosure provides an array substrate, the array substrate comprises: a base substrate and an imaging array, arranged on the substrate, the imaging array comprises a photoelectric detection circuit and a temperature detection circuit, the photoelectric detection circuit includes a photosensitive sensor configured to detect light for imaging, and the temperature detection circuit includes a temperature sensitive sensor configured to detect temperature.

For example, in the array substrate provided by an embodiment of the present disclosure, the temperature sensitive sensor is closer to the base substrate than the photosensitive sensor in a direction perpendicular to the base substrate.

For example, in the array substrate provided by an embodiment of the present disclosure, the temperature sensitive sensor and the photosensitive sensor overlap in the direction perpendicular to the base substrate.

For example, in the array substrate provided by an embodiment of the present disclosure, the temperature sensitive sensor comprises the temperature sensitive diode, the temperature sensitive diode comprises a PIN junction, and the PIN junction comprises a P-type semiconductor layer, an N-type semiconductor layer and an intrinsic layer, the P-type semiconductor layer, the N-type semiconductor layer and the intrinsic layer are arranged side by side on the base substrate and are located on a same layer with respect to the base substrate.

For example, the array substrate provided in one embodiment of the present disclosure further includes a light shielding layer, and the light shielding layer is disposed at least on a side facing outside of the intrinsic layer and overlaps with the intrinsic layer.

For example, in the array substrate provided by an embodiment of the present disclosure, the temperature detection circuit further comprises a first transistor, an active layer of the first transistor is located on a same layer as the PIN junction of the temperature sensitive diode.

For example, in the array substrate provided by an embodiment of the present disclosure, the light shielding layer is a metal layer located on a same layer as a gate of the first transistor, and a first insulating layer is disposed between the light shielding layer and the intrinsic layer.

For example, in the array substrate provided by an embodiment of the present disclosure, the PIN junction further comprises a lightly doped layer, which is located between the N-type semiconductor layer or the P-type semiconductor layer and the intrinsic layer.

For example, in an array substrate provided by an embodiment of the present disclosure, the photosensitive sensor comprises a photodiode, the photodiode comprises a PIN junction, and the PIN junction comprises a P-type semiconductor layer, an intrinsic layer and an N-type semiconductor layer, a P-type semiconductor layer, an intrinsic layer and an N-type semiconductor are laminated on the base substrate, and the photoelectric detection circuit further comprises a third transistor.

For example, in the array substrate provided by an embodiment of the present disclosure, an active layer of the third transistor, the PIN junction, and the active layer of the first transistor are located on a same layer.

For example, in the array substrate provided by an embodiment of the present disclosure, the array substrate further comprises a display array including a display pixel circuit and a display pixel circuit including a second transistor and a light emitting element, the photodiode includes a first electrode and a second electrode opposite to the first electrode, the first electrode of the photodiode is electrically connected with a first electrode of the third transistor, the light emitting element comprises a first electrode and a second electrode opposite to the first electrode, the first electrode of the light emitting element is electrically connected with a first electrode of the second transistor through a connecting electrode, and the first electrode of the photodiode is located on a same layer as the connection electrode, and the second electrode of the photodiode is located on a same layer as the first electrode of the light emitting element.

For example, in the array substrate provided by an embodiment of the present disclosure, the second electrode of the Photodiode is electrically connected with the first voltage terminal, the second electrode of the third transistor is electrically connected with the detection signal line, and the gate of the third transistor is electrically connected with the first scanning line; the temperature sensitive diode comprises a first electrode and a second electrode, the first electrode of the temperature sensitive diode is electrically connected with the first electrode of the first transistor, and the second electrode of the temperature sensitive diode is electrically connected with a second voltage terminal; the second electrode of the first transistor is electrically connected to the detection signal line, and the gate of the first transistor is electrically connected to the second scanning line.

For example, in an array substrate provided by an embodiment of the present disclosure, the display array and the imaging array overlap each other, and the imaging array is disposed in an edge region on a side of the base substrate.

For example, in the array substrate provided by an embodiment of the present disclosure, the second electrode of the photodiode is electrically connected with the first voltage terminal, the second electrode of the third transistor is electrically connected with the first detection signal line, and the gate of the third transistor is electrically connected with the first scanning line; the temperature sensitive diode comprises a first electrode and a second electrode, the first electrode of the temperature sensitive diode is electrically connected with the first electrode of the first transistor, and the second electrode of the temperature sensitive diode is electrically connected with a second voltage terminal, the second electrode of the first transistor is electrically connected with a second detection signal line, and the gate of the first transistor is electrically connected with a second scanning line.

For example, in the array substrate provided in one embodiment of the present disclosure, the array substrate further includes a processor connected to the temperature detection circuit and the photoelectric detection circuit in a signal connection manner and configured to correct a detection result of the photoelectric detection circuit according to a detection result of the temperature detection circuit.

At least one embodiment of the present disclosure also provides a display panel including the array substrate according to any as mentioned above.

For example, in the display panel provided in one embodiment of the present disclosure, the display panel further includes a processor connected to the temperature detection circuit and the photoelectric detection circuit in a signal connection manner and configured to correct a detection result of the photoelectric detection circuit according to a detection result of the temperature detection circuit.

At least one embodiment of the present disclosure also provides an operating method of the display panel, including: detecting light by using the photoelectric detection circuit to obtain a light detection result; detecting temperature by using the temperature detection circuit to obtain a temperature detection result; correcting the light detection result by the temperature detection result, and the corrected light detection structure is used for imaging.

For example, in the operating method of the display panel provided by an embodiment of the present disclosure, the temperature detection circuit and the photoelectric detection circuit are connected to a same detection signal line, and the detecting light by using the photoelectric detection circuit and the detecting temperature by using the temperature detection circuit are performed at different times using the detection signal line in a time division multiplexing manner.

For example, in the operating method of the display panel provided by an embodiment of the present disclosure, the display panel further comprises a processor connected in signal with the temperature detection circuit and the photoelectric detection circuit, and the correcting the light detection result by the temperature detection result comprises: the processor corrects the light detection result using the temperature detection result.

BRIEF DESCRIPTION OF THE DRAWINGS

The above and/or additional aspects and advantages of the present disclosure will become apparent and readily understood from the description of the embodiments taken in conjunction with the following drawings.

DETAILED DESCRIPTION

Figure 1:
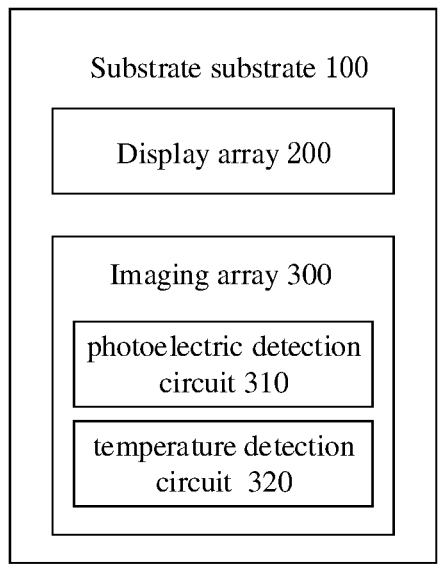
FIG. 1 is a schematic block diagram of an array substrate according to an embodiment of the present disclosure.

In order to make objects, technical details and advantages of the embodiments of the present disclosure, the technical solutions of the embodiments will be described in a clearly and fully understandable way in connection with the drawings related to the embodiments of the disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In an in-cell display structure, photoelectric detection circuits are usually disposed on an array substrate. Photoelectric detection circuits usually include photosensitive sensors (such as Photodiode) to detect light, thus realizing full screen fingerprint recognition, iris recognition, face recognition and other functions. Since the processes of the film layer of each component in the photoelectric detection circuit and the process of the display array are compatible (except for the process of separately adding PN junction or PIN junction of Photodiode), the display screen can be made thinner, with higher integration level and lower cost.

However, Photodiode is susceptible to temperature. When the intensity of the light irradiated on the Photodiode is constant, Photodiode has different current responses at different temperatures, thus making the light detection result susceptible to temperature and the detection accuracy is low.

At least one embodiment of the present disclosure provides an array substrate and a display panel. By arranging a temperature detection circuit on the array substrate, the accuracy of a light detection result can be improved, the light detection result is prevented from being affected by temperature, the photosensitive performance and photosensitive area of the Photodiode are not affected, the structure is simple, and the process difficulty is low.

Alternatively, the photoelectric detection circuit and the temperature detection circuit may also be simultaneously disposed on other substrates of the display panel, for example, on an opposite substrate; alternatively, one of the photoelectric detection circuit and the temperature detection circuit is disposed on the array substrate and the other is disposed on the opposite substrate, and the embodiment of the present disclosure is not limited thereto.

Hereinafter, embodiments of the present disclosure will be described in detail with reference to the accompanying drawings. It should be noted that the same reference numerals in different drawings will be used to refer to the same elements already described.

At least one embodiment of the present disclosure provides an array substrate, which comprises a base substrate and an imaging array arranged on the base substrate, the imaging array comprises a photoelectric detection circuit and a temperature detection circuit.

At least one embodiment of that present disclosure provides an array substrate, which comprises a base substrate and an imaging array arrange on the base substrate, and the imaging array comprises a photoelectric detection circuit and a temperature detection circuit. The photoelectric detection circuit includes a photosensitive sensor, such as a photodiode, is configured to detect light so as to be utilized during imaging. The temperature detection circuit includes a temperature sensor, such as a temperature sensitive diode, configured to detect temperature.

For example, the array substrate further includes a display array.

FIG. 1 is a schematic block diagram of an array substrate according to an embodiment of the present disclosure. Referring to FIG. 1, an array substrate 10 includes a base substrate 100 and an imaging array 300 disposed on the base substrate 100. The imaging array 300 includes a photoelectric detection circuit 310 and a temperature detection circuit 320.

For example, the array substrate further includes a display array 200.

For example, the display array 200 is used for display, and may be an Organic Light Emitting Diode (OLED) array, a liquid crystal drive circuit array, or other suitable display arrays. For example, the imaging array 300 is used for detecting light for imaging, so as to cooperate with other components arranged separately to realize functions of fingerprint recognition, iris recognition, face recognition, etc. For example, in one example, the display array 200 and the imaging array 300 overlap each other and distribute uniformly on the base substrate 100, in order to realize full screen light detection (e.g., for full screen fingerprint identification) while realizing the display function. For example, in another example, the display array 200 and the imaging array 300 are separated from each other, and the imaging array 300 is disposed, for example, in an edge region on a side of the base substrate 100, so that mutual interference between the display array 200 and the imaging array 300 can be avoided, and light detection (for example, for iris recognition or face recognition, etc.) can also be realized while the display function is realized.

For example, the photoelectric detection circuit 310 includes a photosensitive sensor (e.g., photodiode) configured to detect light for imaging. The temperature detection circuit 320 includes a temperature sensitive sensor (e.g., a temperature sensitive diode) configured to detect temperature.

For example, during operation, the temperature is detected by the temperature detection circuit 320 to obtain a temperature detection result, the light is detected by the photoelectric detection circuit 310 to obtain a light detection result, the light detection result is corrected by the temperature detection result, and the corrected light detection result is used for imaging, so as to cooperate with other components additionally arranged to realize the functions of fingerprint recognition, iris recognition, face recognition and the like.

Since the photodiode is easily affected by temperature, the accuracy of the light detection result is relatively low. By setting the temperature detection circuit 320 to carry out temperature detection and correcting the light detection result by using the temperature detection result, the light detection result can be prevented from being affected by temperature, and the accuracy of the light detection result can be effectively improved.

It should be noted that in the embodiment of the present disclosure, the temperature sensitive sensor includes but is not limited to a temperature sensitive diode, and may also be a silicon controlled temperature sensor, a thermistor, etc. The embodiment of the present disclosure is not limited to this. The photosensitive sensor includes, but is not limited to, the photodiode, and may also be a photomultiplier tube, a photoresistor, a phototransistor, an infrared sensor, etc. The embodiments of the present disclosure are not limited to this. For example, the photodiode may be used to detect visible light, infrared light, etc.

It should be noted that in the embodiment of the present disclosure, the specific circuit structures of the photoelectric detection circuit 310 and the temperature detection circuit 320 are not limited, and may be any detection circuit structure, for example, may be determined according to the type, performance and usage manner of components (e.g., a temperature-sensitive sensor and a photosensitive sensor) used, or may be a conventional detection circuit structure.

It should be noted that in the embodiment of the present disclosure, the light detection result of the photoelectric detection circuit 310 and the temperature detection result of the temperature detection circuit 320 may be used to realize any function requiring the light detection. By correcting the light detection result using the temperature detection result, the accuracy of the corresponding function using the light detection result can be effectively improved.

Figure 2:
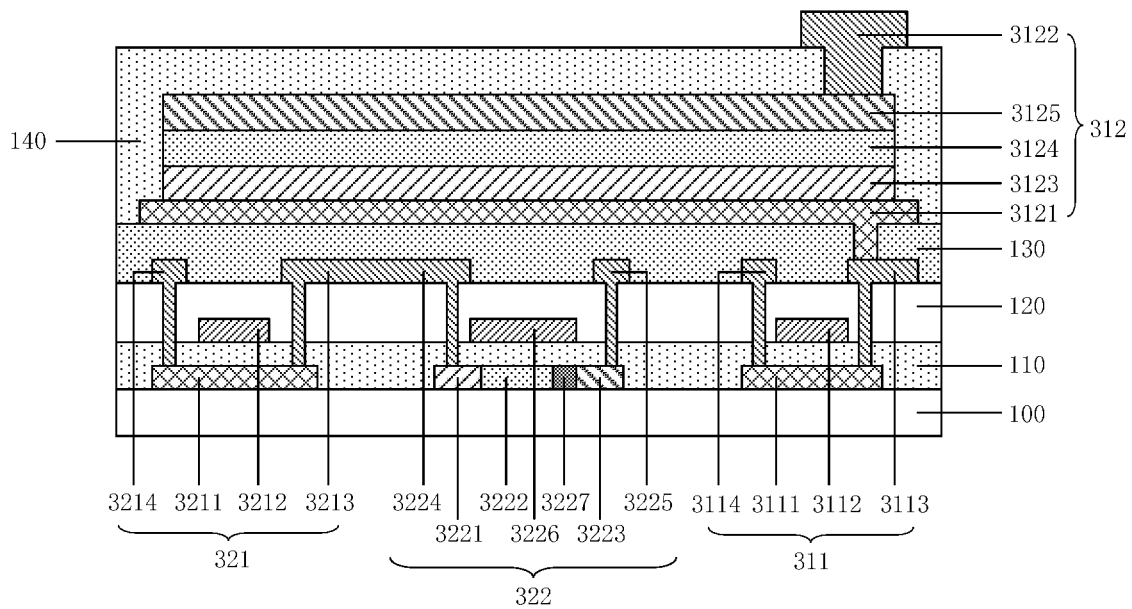
FIG. 2 is a schematic cross-sectional view of an array substrate according to an embodiment of the present disclosure.

FIG. 2 is a schematic cross-sectional view of an array substrate according to an embodiment of the present disclosure. For example, the temperature detection circuit 320 includes a first transistor 321 and a temperature sensitive diode 322, and the photoelectric detection circuit 310 includes a third transistor 311 and a photodiode 312. As shown in FIG. 2, the first transistor 321, the temperature sensitive diode 322, the third transistor 311, and the photodiode 312 are all disposed on the base substrate 100.

For example, the first transistor 321 includes an active layer 3211, a gate 3212, a first electrode 3213, and a second electrode 3214. The active layer 3211 of the first transistor 3211 is disposed on the base substrate 100 and covered by the first insulating layer 110. The gate 3212 of the first transistor 321 is disposed on the first insulating layer 110 and covered by the second insulating layer 120. The first electrode 3213 and the second electrode 3214 of the first transistor 321 are disposed on the second insulating layer 120, and are electrically connected to both ends of the active layer 3211 of the first transistor 321 by through holes penetrating through the first insulating layer 110 and the second insulating layer 120. For example, the first electrode 3213 and the second electrode 3214 of the first transistor 321 are symmetrically arranged, and the two electrodes may be interchanged, one of which is a source and the other is a drain.

For example, the temperature sensitive diode 322 includes a PIN junction, a first electrode 3224, and a second electrode 3225. The PIN junction includes a P-type semiconductor layer 3221, an intrinsic layer 3222, and an N-type semiconductor layer 3223. For example, the P-type semiconductor layer 3221, the intrinsic layer 3222, and the N-type semiconductor layer 3223 are arranged in parallel on the base substrate 100, and are located on the same layer with respect to the base substrate 100, that is, the PIN junction has a transverse structure. For example, the PIN junction of the temperature sensitive diode 322 is located on the same layer as the active layer 3211 of the first transistor 321. The first insulating layer 110 is disposed on the base substrate 100 and covers the PIN junction. The first electrode 3224 and the second electrode 3225 of the temperature sensitive diode 322 are disposed on the second insulating layer 120, and are electrically connected to the P-type semiconductor layer 3221 and the N-type semiconductor layer 3223 by through holes penetrating through the first insulating layer 110 and the second insulating layer 120, respectively. For example, in a direction parallel to the base substrate 100, the first electrode 3224 and the second electrode 3225 of the temperature sensitive diode 322 are oppositely disposed, the first electrode 3224 is, for example, an anode, and the second electrode 3225 is, for example, a cathode. For example, the first electrode 3224 of the temperature sensitive diode 322 is also electrically connected to the first electrode 3213 of the first transistor 321.

For example, in one example, the temperature sensitive diode 322 further includes a light shielding layer 3226, which is disposed at least on a side facing outside of the intrinsic layer and overlaps with the intrinsic layer. For example, the light shielding layer 3226 is disposed on the first insulating layer 110 and overlaps with the intrinsic layer 3222, that is, the light shielding layer 3226 is indirectly disposed on the intrinsic layer 3222 to prevent external light from irradiating the intrinsic layer 3222. The light shielding layer 3226 can prevent external light from affecting the PIN junction of the temperature sensitive diode 322 to improve the accuracy of temperature detection. For example, the light shielding layer 3226 is located on the same layer as the gate 3212 of the first transistor 321. For example, the light shielding layer 3226 may be a floating metal layer, so that the light shielding layer 3226 may be fabricated in the same process as the gate 3212 of the first transistor 321 to reduce the production cost. Of course, the embodiment of the present disclosure is not limited to this, and the light shielding layer 3226 may be made of metal oxide or other suitable materials.

For example, in one example, the PIN junction of the temperature sensitive diode 322 further includes a lightly doped layer 3227. The lightly doped layer 3227 is located between the N-type semiconductor layer 3223 and the intrinsic layer 3222, and is located on the same layer as the N-type semiconductor layer 3223 and the intrinsic layer 3222. The lightly doped layer 3227 can effectively prevent leakage current. It should be noted that in the embodiment of the present disclosure, the placement position of the lightly doped layer 3227 is not limited, and may be disposed between the P-type semiconductor layer 3221 and the intrinsic layer 3222, which may be determined according to actual requirements.

For example, the third transistor 311 includes an active layer 3111, a gate 3112, a first electrode 3113, and a second electrode 3114. The active layer 3111 of the third transistor 311 is disposed on the base substrate 100 and covered by the first insulating layer 110. The gate 3112 of the third transistor 311 is disposed on the first insulating layer 110 and covered by the second insulating layer 120. The first electrode 3113 and the second electrode 3114 of the third transistor 311 are disposed on the second insulating layer 120, and are electrically connected to both ends of the active layer 3111 of the third transistor 311 by through holes penetrating through the first insulating layer 110 and the second insulating layer 120. For example, the first electrode 3113 and the second electrode 3114 of the third transistor 311 are symmetrically arranged and may be interchanged, one of which is a source and the other is a drain.

For example, the photodiode 312 includes a first electrode 3121, a second electrode 3122, a photosensitive N-type semiconductor layer 3123, a photosensitive intrinsic layer 3124, and a photosensitive P-type semiconductor layer 3125. The first electrode 3121 of the photodiode 312 is disposed on the third insulating layer 130, and is electrically connected to the first electrode 3113 of the third transistor 311 through a via hole penetrating the third insulating layer 130. The photosensitive N-type semiconductor layer 3123, the photosensitive intrinsic layer 3124, and the photosensitive P-type semiconductor layer 3125 are sequentially laminated on the first electrode 3121 of the photodiode 312. The planarization layer 140 is disposed on the third insulating layer 130 and covers the first electrode 3121, the photosensitive N-type semiconductor layer 3123, the photosensitive intrinsic layer 3124, and the photosensitive P-type semiconductor layer 3125 of the photodiode 312. The second electrode 3122 of the photodiode 312 is disposed on the planarization layer 140, and is electrically connected to the photosensitive P-type semiconductor layer 3125 through a via hole penetrating through the planarization layer 140. For example, in a direction perpendicular to the base substrate 100, the first electrode 3121 and the second electrode 3122 of the photodiode 312 are oppositely disposed, the first electrode 3121 is, for example, an anode, the second electrode 3122 is, for example, a cathode, and the photodiode 312 has a longitudinal structure.

In this embodiment, the temperature sensitive diode 322 is closer to the base substrate 100 relative to the photodiode 312 in a direction perpendicular to the base substrate 100. For example, in one example, the temperature sensitive diode 322 and the photodiode 312 overlap in a direction perpendicular to the base substrate 100. Since the PIN of the temperature sensitive diode 322 is in a transverse structure, the temperature sensitive diode 322 may be fabricated under the photodiode 312, thus not affecting the photosensitive performance and photosensitive area of the photodiode 312.

For example, the active layer 3211 of the first transistor 321, the PIN junction of the temperature sensitive diode 322 and the active layer 3111 of the third transistor 311 are located on the same layer, so they may be fabricated in the same process (e.g., PMOS process), which is beneficial to reduce the production cost. For example, in this PMOS process, the transverse PIN junction in the temperature sensitive diode 322 may be fabricated by adjusting the doping amount. For example, the gate 3212 of the first transistor 321, the light shielding layer 3226 of the temperature sensitive diode 322, and the gate 3112 of the third transistor 311 are located in the same layer, so they can be fabricated in the same process (e.g., metal deposition and photolithography process), which is beneficial to reduce the production cost. The array substrate 10 is simple in structure, low in process difficulty and easy to realize.

In this embodiment, by arranging the temperature detection circuit 320 (the first transistor 321 and the temperature sensitive diode 322) on the array substrate 10, the accuracy of the light detection result can be improved, the light detection result is prevented from being affected by temperature, and the photosensitive performance and photosensitive area of the photodiode 312 are not affected, so that the structure is simple, and the process difficulty is low.

It should be noted that in the embodiment of the present disclosure, the first transistor 321 and the third transistor 311 may be top gate type thin film transistors or bottom gate type thin film transistors, and FIG. 2 shows a case where they are top gate type thin film transistors. When the above transistor is a bottom gate type thin film transistor, the relative positions of the temperature sensitive diode 322, the first transistor 321 and the third transistor 311 may be adjusted accordingly, or the process may be adjusted.

It should be noted that in the embodiment of the present disclosure, the temperature sensitive diode 322 and the photodiode 312 are both PIN-type, but the embodiment of the present disclosure is not limited to this, and the temperature sensitive diode 322 and the photodiode 312 may also be PN-type as long as their respective temperature sensitivity and photosensitivity meet the use requirements. In the array substrate 10, the material of each film layer may be a related material known by an invertor(s) and will not be described in detail here.

Figure 3:
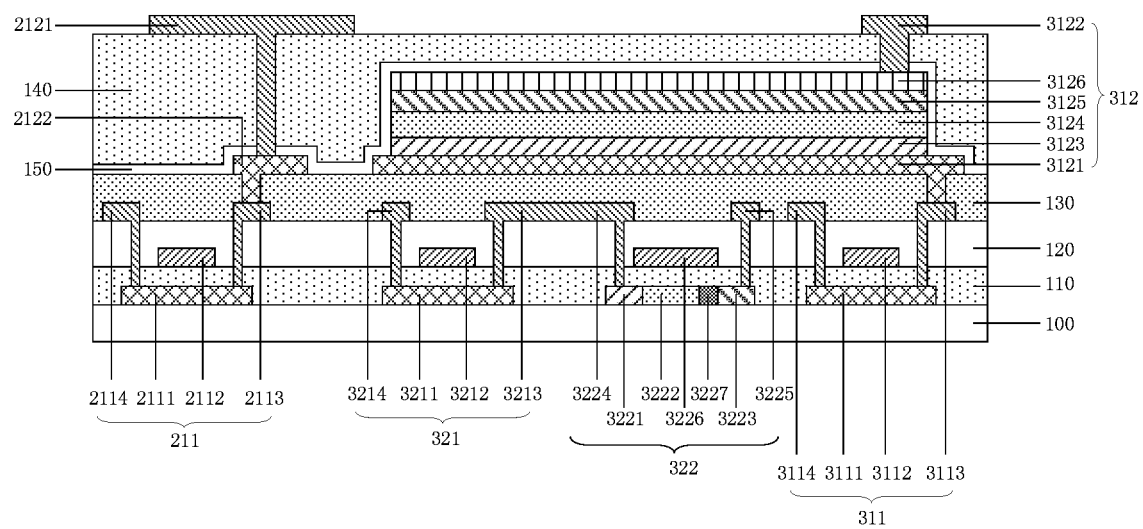
FIG. 3 is a schematic cross-sectional view of another array substrate according to an embodiment of the present disclosure.

FIG. 3 is a schematic cross-sectional view of another array substrate according to an embodiment of the present disclosure. For example, the display array 200 includes a display pixel circuit 210 including a second transistor 211 and a light emitting element. As shown in FIG. 3, the second transistor 211 and the light emitting element (only a partial structure of the light emitting element is shown in the figure) are both disposed on the base substrate 100.

For example, the second transistor 211 includes an active layer 2111, a gate 2112, a first electrode 2113, and a second electrode 2114. The active layer 2111 of the second transistor 211 is disposed on the base substrate 100 and covered by the first insulating layer 110. The gate 2112 of the second transistor 211 is disposed on the first insulating layer 110 and covered by the second insulating layer 120. The first electrode 2113 and the second electrode 2114 of the second transistor 211 are disposed on the second insulating layer 120, and are electrically connected to both ends of the active layer 2111 of the second transistor 211 by through holes penetrating through the first insulating layer 110 and the second insulating layer 120. For example, the first electrode 2113 and the second electrode 2114 of the second transistor 211 are symmetrically arranged, and the two electrodes 2113 and 2114 may be interchanged, one of which is a source and the other is a drain.

For example, the light emitting element includes a first electrode 2121 and a second electrode (not shown) opposite to the first electrode 2121. The first electrode 2121 of the light emitting element is disposed on the planarization layer 140, and is electrically connected to a connection electrode 2122 through a via hole penetrating through the planarization layer 140. The connection electrode 2122 is disposed on the third insulating layer 130 and is electrically connected to the first electrode 2113 of the second transistor 211 through a via hole penetrating through the third insulating layer 130. Therefore, with the above structure, the first electrode 2121 of the light emitting element is electrically connected to the first electrode 2113 of the second transistor 211 through the connection electrode 2122. For example, the light emitting element may be an OLED, where the first electrode 2121 of the light emitting element is, for example, an anode of the OLED.

Compared with the array substrate 10 shown in FIG. 2, in this embodiment, the photodiode 312 further includes a transparent electrode 3126 disposed on the photosensitive P-type semiconductor layer 3125 to enhance conductivity. The second electrode 3122 of the photodiode 312 is electrically connected to the transparent electrode 3126 through a via hole. The protective layer 150 is disposed between the third insulating layer 130 and the planarization layer 140.

For example, in this embodiment, the first electrode 3121 of the photodiode 312 and the connection electrode 2122 are located on the same layer, so they may be fabricated in the same process, which is beneficial to reduce the production cost. The second electrode 3122 of the photodiode 312 is located on the same layer as the first electrode 2121 of the light emitting element, so it may also be fabricated in the same process, which is beneficial to reduce the production cost.

It should be noted that arrangements of the temperature sensitive diode 322 and the first transistor 321 in FIG. 3 are similar to that in FIG. 2, and will not be described here again. The array substrate 10 may also include more or fewer components, and the relative positional relationship of components is not limited and may be determined according to actual requirements.

Figure 4:
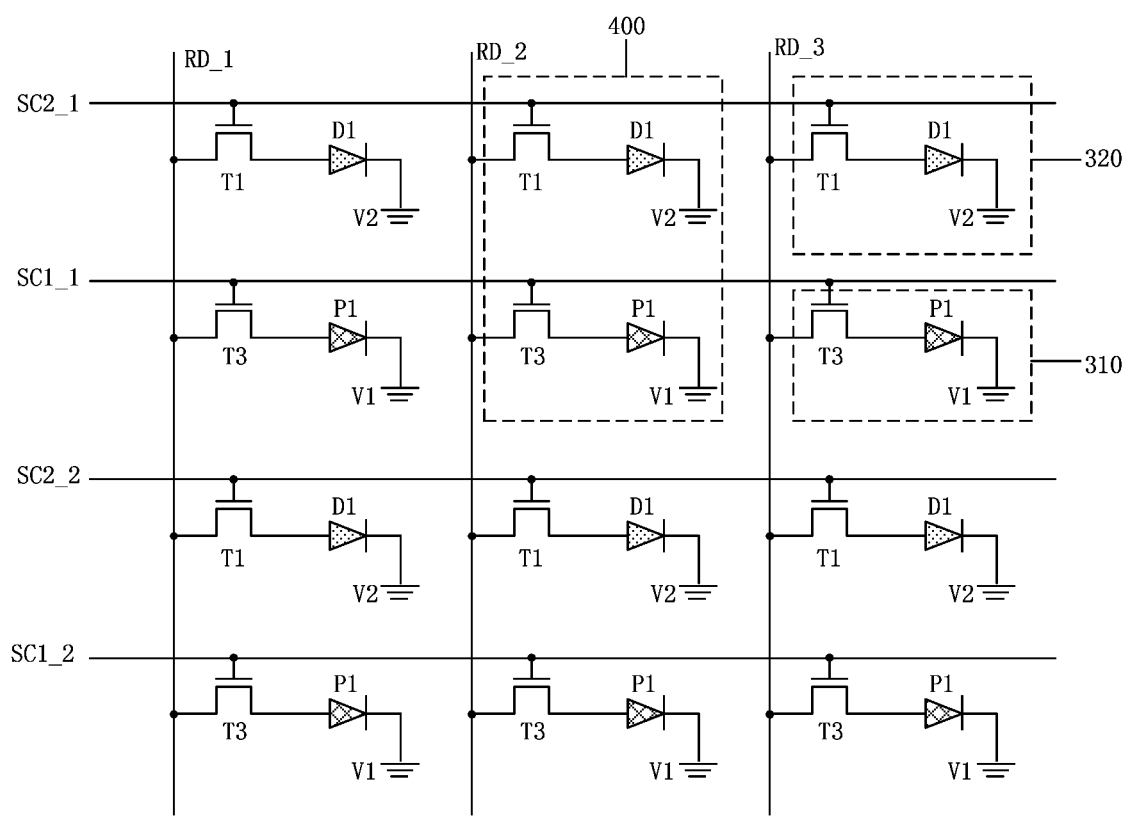
FIG. 4 is a schematic diagram of a driving circuit of an array substrate according to an embodiment of the present disclosure.

FIG. 4 is a schematic diagram of a driving circuit of an array substrate according to an embodiment of the present disclosure. Referring to FIG. 4, the array substrate 10 includes a plurality of detection units 400, each of which includes a photoelectric detection circuit 310 and a temperature detection circuit 320.

For example, the array substrate 10 further includes a plurality of detection signal lines RD_1, RD_2, and RD_3, and the photoelectric detection circuits 310 and the temperature detection circuits 320 of the detection units 400 located in the same column are connected to the same detection signal line. For example, the photoelectric detection circuit 310 and the temperature detection circuit 320 respectively perform detection and signal transmission at different times, so that they may be connected to the same detection signal line in a time division multiplexing manner to reduce the number of signal lines of the array substrate 10. Of course, the embodiment of the present disclosure is not limited to this, and the photoelectric detection circuits 310 and the temperature detection circuits 320 of the detection units 400 located in the same column may be connected to different detection signal lines, respectively. Only three detection signal lines are shown in FIG. 4, but the embodiment of the present disclosure is not limited thereto, and the number of detection signal lines may be any number, which may be determined according to actual requirements.

For example, the array substrate 10 further includes a plurality of first scanning lines SC1_1, SC1_2 and a plurality of second scanning lines SC2_1, SC2_2. For example, the photoelectric detection circuits 310 of the detection units 400 located in the same row are connected to the same first scanning line, and the temperature detection circuits 320 of the detection units 400 located in the same row are connected to the same second scanning line. Only two first scanning lines and two second scanning lines are shown in FIG. 4, but embodiments of the present disclosure are not limited thereto, and the number of the first scanning lines and the second scanning lines may be any number, which may be determined according to actual requirements.

For example, the photoelectric detection circuit 310 includes a third transistor T3 and a photodiode P1. The third transistor T3 may be the third transistor 311 shown in FIG. 2 and FIG. 3, and the photodiode P1 may be the photodiode 312 shown in FIG. 2 and FIG. 3. The first electrode (e.g., anode) of the photodiode P1 is electrically connected to the first electrode of the third transistor T3, and the second electrode (e.g., cathode) of the photodiode P1 is electrically connected to the first voltage terminal V1. The second electrode of the third transistor T3 is electrically connected to the detection signal lines RD_1, RD_2 or RD_3, and the gate of the third transistor T3 is electrically connected to the first scanning line SC1_1 or SC1_2.

For example, the temperature detection circuit 320 includes a first transistor T1 and a temperature sensitive diode D1. The first transistor T1 may be the first transistor 321 shown in FIG. 2 or FIG. 3, and the temperature sensitive diode D1 may be the temperature sensitive diode 322 shown in FIG. 2 or FIG. 3. The first electrode (e.g., anode) of the temperature sensitive diode D1 is electrically connected to the first electrode of the first transistor T1, and the second electrode (e.g., cathode) of the temperature-sensitive diode D1 is electrically connected to the second voltage terminal V2. The second electrode of the first transistor T1 is electrically connected to the detection signal lines RD_1, RD_2 or RD_3, and the gate of the first transistor T1 is electrically connected to the second scanning line SC2_1 or SC2_2.

During operation, the temperature sensitive diode D1 senses the temperature of the environment and generates a corresponding current, which is transmitted to the detection signal line through the first transistor T1 and further transmitted to other components (such as an A/D converter, a processor, and the like) which are separately arranged, thereby obtaining a temperature detection result. The photodiode P1 generates a corresponding current under the irradiation of light from outside of the array substrate 10, and the current is transmitted to the detection signal line through the third transistor T3 and further transmitted to other components separately provided, thereby obtaining a light detection result. The temperature detection result is used to correct the light detection result, and the corrected light detection result is used for imaging, so as to cooperate with other components arranged separately to realize the functions of fingerprint recognition, iris recognition, face recognition and the like. In this way, the accuracy of the light detection result can be improved, the light detection result is prevented from being affected by temperature, and the photosensitive performance and photosensitive area of the photodiode P1 are not affected, such structure is simple, and the process difficulty is low.

For example, in one example, at the initial time (for example, the temperature is 25 degrees at this moment), a value of a dark current of the temperature sensitive diode D1 at this temperature (or a current value within a period of time) may be obtained. When the temperature changes (for example, the temperature rises to 26 degrees), the dark current of the temperature sensitive diode D1 changes (the dark current usually increases with the increase of the temperature). At this time, the closing effect of the first transistor T1 will be worse, which is also beneficial to the dark current outflow of the temperature sensitive diode D1. Since the current detected at this time is different from the current detected at 25 degrees, it can be determined whether the temperature increases or decreases, and the increasing number and the decreasing number of the temperature. For example, the temperature change amount and/or the current temperature are fed back to a separately arranged processor to correct the light detection result, thereby reducing or even avoiding the influence of temperature on the light detection result. It should be noted that in the embodiment of the present disclosure, the temperature detection may be performed by using the current-temperature characteristic of the temperature sensitive diode D1 in a turn-off state or the current-temperature characteristic of the temperature sensitive diode D1 in a turn-on state, and the embodiment of the present disclosure is not limited to this.

For example, a first voltage terminal V1 and a second voltage terminal V2 are configured to keep inputting of the DC low level signal, such as grounded. A first voltage of the first voltage terminal V1 and a second voltage of the second voltage terminal V2 may be the same or different. For example, the first voltage terminal V1 and the second voltage terminal V2 may be connected to the same voltage line to receive the same voltage signal.

It should be noted that, in the embodiment of the present disclosure, FIG. 4 only shows the circuit connection relation of each component, and does not represent the actual distribution position of each component and circuit, the actual distribution position of each component and circuit may refer to the structure shown in FIG. 2 and FIG. 3, for example, the temperature sensitive diode D1 is arranged under the photodiode P1, and the specific arrangement manner will not be described here. The photoelectric detection circuit 310 and the temperature detection circuit 320 are not limited to the circuit structure described in FIG. 4, and may have any detection circuit structure, and the embodiment of the present disclosure is not limited thereto.

It should be noted that in the embodiment of the present disclosure, the array substrate 10 includes, for example, a plurality of display units including, for example, a display pixel circuit 210 and a detection unit 400. For example, all of the display units may include the detection unit 400, or only a portion of the display units may include the detection unit 400. In the array substrate 10, the number of detection units 400 is not limited and may be one or more, depending on the detection accuracy to be achieved.

Figure 5A:
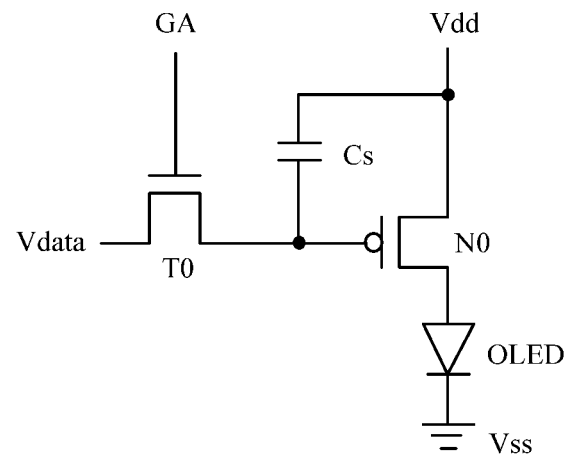
FIG. 5A is a schematic diagram of a pixel circuit.
Figure 5B:
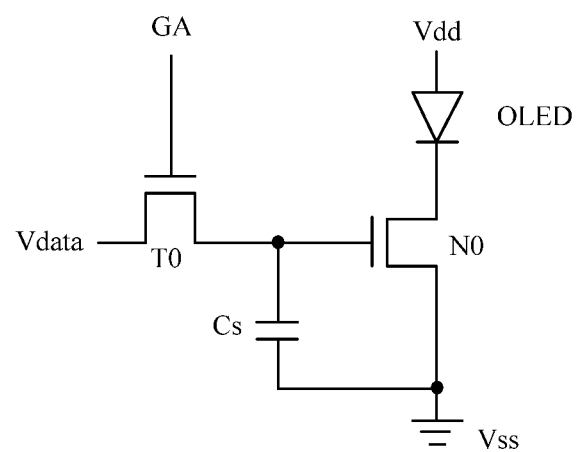
FIG. 5B is a schematic diagram of another pixel circuit.

For example, when the array substrate 10 is an OLED array substrate, the display pixel circuit 210 may be any suitable pixel circuit such as 2T1C, 4T1C, 4T2C, etc. The embodiments of the present disclosure are not limited to this. The basic pixel circuit used in the OLED display device is usually 2T1C pixel circuit, that is, two thin-film transistors and a storage capacitor Cs are used to realize a basic function of driving OLED to emit light. FIG. 5A and FIG. 5B are schematic diagrams of two kinds of pixel circuits respectively.

As shown in FIG. 5A, a 2T1C pixel circuit includes a switching transistor T0, a driving transistor N0, and a storage capacitor Cs. For example, a gate of the switching transistor T0 is connected to a scanning terminal GA to receive a display scanning signal, a source of the switching transistor T0 is connected to a data terminal Vdata to receive a display data signal, and a drain of the switching transistor T0 is connected to a gate of the driving transistor N0. A source of the driving transistor N0 is connected to a third voltage terminal Vdd to receive a third voltage (e.g., a high voltage), and a drain of the driving transistor N0 is connected to a anode of the OLED. One end of the storage capacitor Cs is connected to the drain of the switching transistor T0 and the gate of the driving transistor N0, and the other end is connected to the source of the driving transistor N0 and the third voltage terminal Vdd. A cathode of the OLED is connected to a fourth voltage terminal Vss to receive a fourth voltage (e.g., low voltage, e.g., the grounding voltage). The driving mode of the 2T1C pixel circuit is to control the brightness (gray scale) of the pixel via the two TFTs and the storage capacitor Cs. When a display scanning signal is applied through the scanning terminal GA to turn on the switching transistor T0, the display data signal input through the data terminal Vdata will charge the storage capacitor Cs through the switching transistor T0, thereby storing the display data signal in the storage capacitor Cs, and the stored display data signal controls the conduction degree of the driving transistor N0, thereby controlling magnitude of the current flowing through the driving transistor N0 to drive the OLED to emit light, i.e., the current determines the gray scale of the pixel to emit light. In the 2T1C pixel circuit shown in FIG. 5A, the switching transistor T0 is an n-type transistor and the driving transistor N0 is a P-type transistor.

As shown in FIG. 5B, another 2T1C pixel circuit also includes a switching transistor T0, a driving transistor N0, and a storage capacitor Cs, but its connection mode is slightly changed, and the driving transistor N0 is an N-type transistor. The variation of the pixel circuit of FIG. 5B with respect to FIG. 5A includes that the anode of the OLED is connected to the third voltage terminal Vdd to receive a third voltage (e.g., high voltage), the cathode of the OLED is connected to the drain of the driving transistor N0, and the source of the driving transistor N0 is connected to the fourth voltage terminal Vss to receive a fourth voltage (e.g., low voltage, e.g., the grounding voltage). One end of the storage capacitor Cs is connected to the drain of the switching transistor T0 and the gate of the driving transistor N0, and the other end is connected to the source of the driving transistor N0 and the fourth voltage terminal Vss. The operation mode of the 2T1C pixel circuit is basically the same as that of the pixel circuit shown in FIG. 5A, and will not be described here again.

In addition, for the pixel circuit shown in FIG. 5A and FIG. 5B, the switching transistor T0 is not limited to a N-type transistor, but may be a P-type transistor, whereby the polarity of the display scan signal that controls turn-on or turn-off of the switching transistor T0 may be changed accordingly.

For example, the array substrate may further include a processor that is connected to the temperature detection circuit and the photoelectric detection circuit in signal and configured to correct a detection result of the photoelectric detection circuit according to a detection result of the temperature detection circuit.

On the basis of the above 2T1C basic pixel circuit, the display pixel circuit 210 may also be implemented as other pixel circuits with compensation functions, which may be implemented by voltage compensation, current compensation or hybrid compensation, and the pixel circuit with the compensation function may be 4T1C or 4T2C, for example, which will not be described in detail here.

It should be noted that a transistor used in the embodiments of the present disclosure may be a thin film transistor, a field effect transistor or other switching devices with the same characteristic, and the embodiments of the present disclosure are all described with the thin film transistor as an example. The source and drain of the transistor used here may be symmetrical in structure, so the source and drain may have no structural difference. In the embodiment of the present disclosure, in order to distinguish the two electrodes of the transistor except for the gate, one electrode is directly described as the first electrode and the other electrode is described as the second electrode.

In addition, unless specifically explained, the transistors in the embodiments of the present disclosure are all described by taking a N-type transistor as an example, in which the first electrode of the transistor is a drain electrode and the second electrode is a source electrode. It should be noted that this disclosure includes but is not limited to this. For example, one or more transistors in the embodiment of the present disclosure may also adopt P-type transistors. In this case, the first electrode of the transistor is the source electrode and the second electrode is the drain electrode. It is only necessary to connect the electrodes of the selected type of transistor with reference to the electrodes of the corresponding transistor in the embodiment of the present disclosure, and to provide the corresponding high level signal or low level signal for the corresponding voltage terminal and signal terminal. When a N-type transistor is used, Indium Gallium Zinc Oxide (IGZO) may be used as the active layer of the thin film transistor. Compared with low temperature poly-silicon (LTPS) or amorphous silicon (such as hydrogenated amorphous silicon) as the active layer of the thin film transistor, the size of the transistor can be effectively reduced and leakage current can be prevented. When a P-type transistor is used, low temperature poly-silicon (LTPS) or amorphous silicon (such as hydrogenated amorphous silicon) may be used as the active layer of the thin film transistor.

At least one embodiment of the present disclosure also provides a display panel including the array substrate according to any embodiment of the present disclosure. The display panel can improve the accuracy of the light detection result, prevent the light detection result from being affected by temperature, and does not affect the photosensitive performance and photosensitive area of the photodiode, and has simple structure and low process difficulty.

Figure 6:
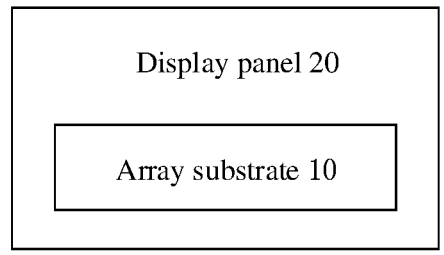
FIG. 6 is a schematic block diagram of a display panel according to an embodiment of the present disclosure.

FIG. 6 is a schematic block diagram of a display panel according to an embodiment of the present disclosure. Referring to FIG. 6, the display panel 20 includes an array substrate 10, which is an array substrate according to any embodiment of the present disclosure. For example, the display panel 20 may be an OLED display panel. Of course, the embodiment of the present disclosure is not limited to this, and the display panel 20 may also be a liquid crystal display panel, an electronic ink display panel, or the like. The technical effect of the display panel 20 may refer to the corresponding description of the array substrate 10 in the above-mentioned embodiment, which is not repeated here. It should be understood for those of ordinary skill in the art to have other components of the display panel 20, which are not described in detail herein, and it cannot be taken as limitations to the embodiments of the present disclosure.

For example, the display panel may further include a processor that is connected to the temperature detection circuit and the photoelectric detection circuit in signal and configured to correct a detection result of the photoelectric detection circuit according to a detection result of the temperature detection circuit.

At least one embodiment of the present disclosure also provides a display device including the array substrate according to any embodiment of the present disclosure or the display panel according to any embodiment of the present disclosure. The display device can improve the accuracy of the light detection result, prevent the light detection result from being affected by temperature, and does not affect the photosensitive performance and photosensitive area of the photodiode, and has simple structure and low process difficulty.

Figure 7:
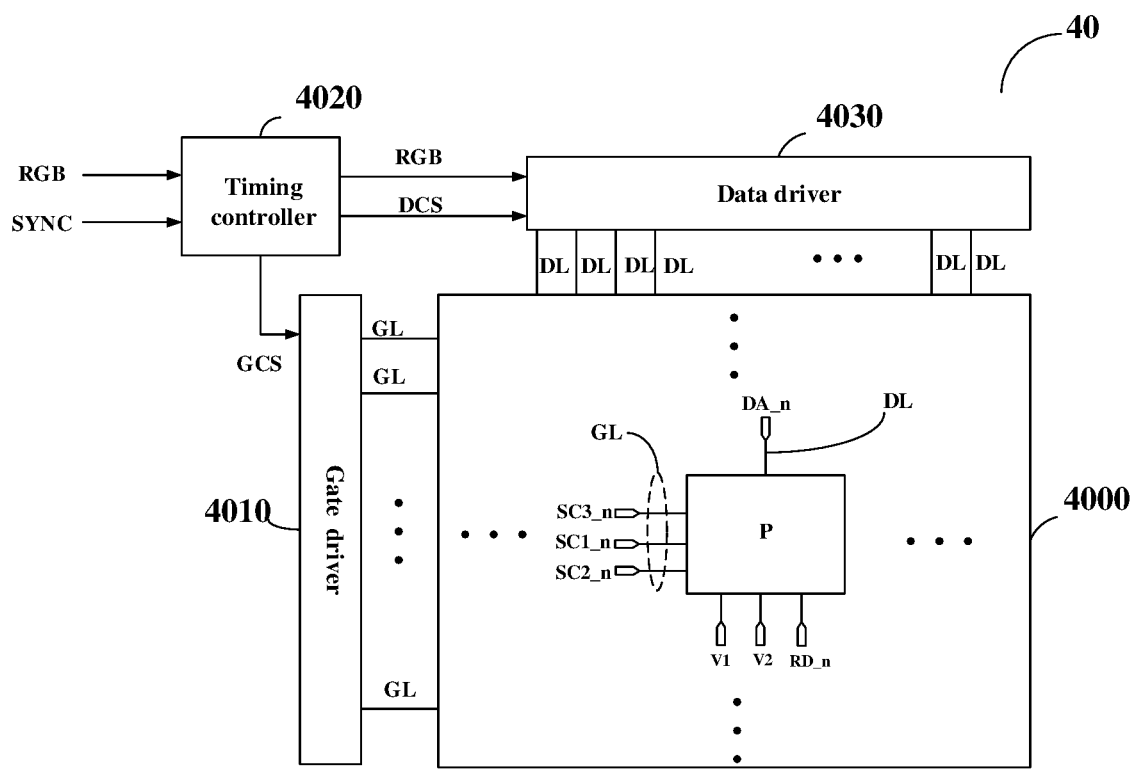
FIG. 7 is a schematic block diagram of a display device according to an embodiment of the present disclosure.

FIG. 7 is a schematic block diagram of a display device according to an embodiment of the present disclosure. Referring to FIG. 7, the display device 40 includes a display panel 4000, which is a display panel according to any embodiment of the present disclosure, or the display panel 4000 includes an array substrate according to any embodiment of the present disclosure. For example, the display device 40 may be a OLED television, an OLED display or the like, or may be any product or component having a display function such as an electronic book, a mobile phone, a tablet computer, a notebook computer, a digital photo frame, a navigator or the like, and the embodiments of the present disclosure are not limited thereto. The technical effects of the display device 40 may refer to the corresponding descriptions of the array substrate 10 and the display panel 20 in the above embodiments, and will not be described again here.

For example, in one example, the display device 40 includes a display panel 4000, a gate driver 4010, a timing controller 4020, and a data driver 4030. The display panel 4000 includes a plurality of pixel regions P defined by intersection of a plurality of scanning lines GL and a plurality of data lines DL; the gate driver 4010 is used to drive a plurality of scanning lines GL; the data driver 4030 is used for driving a plurality of data lines DL; the timing controller 4020 is used for processing image data RGB input from outside of the display device 40, supplying the processed image data RGB to the data driver 4030, and outputting a scan control signal GCS and a data control signal DCS to the gate driver 4010 and the data driver 4030 to control the gate driver 4010 and the data driver 4030.

For example, the display panel 4000 includes a plurality of pixel regions P; the pixel region P is a pixel unit, and includes, for example, the display pixel circuit 210, the photoelectric detection circuit 310, and the temperature detection circuit 320 provided in any of the above embodiments. The display panel 4000 further includes a plurality of scanning lines GL and a plurality of data lines DL. For example, the pixel region P is provided at an intersection region of the scanning line GL and the data line DL. For example, each pixel region P is connected to three scanning lines GL (providing a first scanning signal, a second scanning signal, and a display scanning signal, respectively), one data line DL (providing a display data signal), a detection signal line, a first voltage line for providing a first voltage, and a second voltage line for providing a second voltage. For example, the first voltage line or the second voltage line may be replaced with a corresponding plate-shaped common electrode (e.g., a common anode or a common cathode). Note that only a portion of the pixel regions p, the scanning lines GL, and the data lines DL are shown in FIG. 7.

For example, the gate driver 4010 supplies a plurality of selecting signals to a plurality of scanning lines GL according to a plurality of scanning control signals GCS originating from the timing controller 4020. The plurality of selecting signals include a first scanning signal, a second scanning signal, a display scanning signal, and the like. These signals are supplied to each pixel region P through a plurality of scanning lines GL.

For example, the data driver 4030 converts digital image data RGB input from the timing controller 4020 into display data signal according to a plurality of data control signals DCS originating from the timing controller 4020 using a reference gamma voltage. The data driver 4030 supplies converted display data signal to the plurality of data lines DL. For example, the data driver 4030 may also be connected to a plurality of first voltage lines and a plurality of second voltage lines to provide a first voltage and a second voltage, respectively.

For example, the timing controller 4020 processes externally input image data RGB to match the size and resolution of the display panel 4000, and then supplies the processed image data to the data driver 4030. The timing controller 4020 generates a plurality of scanning control signals GCS and a plurality of data control signals DCS using synchronizing signals (e.g., a dot clock DCLK, a data enable signal DE, a horizontal synchronizing signal Hsync, and a vertical synchronizing signal Vsync) input from outside of the display device 40. The timing controller 4020 provides the generated scanning control signal GCS and data control signal DCS to the gate driver 4010 and the data driver 4030, respectively, for control of the gate driver 4010 and the data driver 4030.

For example, the gate driver 4010 and the data driver 4030 may be implemented as semiconductor chips. The display device 40 may also include other components, such as a signal decoding circuit, a voltage conversion circuit, etc. These components may, for example, adopt components in a related art, which will not be described in detail here.

An embodiment of the present disclosure also provides an operating method of the display panel as described above, including: detecting light by using the photoelectric detection circuit to obtain a light detection result; detecting a temperature by using the temperature detection circuit to obtain a temperature detection result; and correcting the light detection result by using the temperature detection result, and the corrected light detection structure is used for imaging.

For example, the temperature detection circuit and the photoelectric detection circuit are connected to the same detection signal line, the detecting light by using the photoelectric detection circuit and the detecting a temperature by using the temperature detection circuit are performed at different times using the detection signal line in a time division multiplexing manner.

For example, the display panel further includes a processor, which is connected to the temperature detection circuit and the photoelectric detection circuit in a signal connection manner, and the correcting the light detection result by using the temperature detection result, and the corrected light detection structure is used for imaging includes: the processor corrects the light detection result by using the temperature detection result.

For example, the operating method may be a fingerprint recognition method, iris recognition method, etc. At least one embodiment of the present disclosure also provides a fingerprint recognition method. By using the fingerprint recognition method, the accuracy of the light detection result can be improved, and the light detection result can be prevented from being affected by temperature. For example, in one example, the fingerprint recognition method includes performing temperature detection using the temperature detection circuit 320 in the imaging array 300 to obtain a temperature detection result, performing light detection using the photoelectric detection circuit 310 in the imaging array 300 to obtain a light detection result, correcting the light detection result using the temperature detection result, and using the corrected light detection result for fingerprint recognition.

It should be noted that the detailed description and technical effects of the fingerprint identification method can refer to the corresponding descriptions of the array substrate 10, the display panel 20 and the display device 40 in the embodiment of the present disclosure, which will not be repeated here.

For this disclosure, the following points need to be explained:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness a layer or area may be enlarged or narrowed, that is, the drawings are not drawn in a real scale.

(3) Without conflict, the embodiments of the present disclosure and the features in the embodiments can be combined with each other to obtain new embodiments.

The above is only a specific embodiment of the present disclosure, but the scope of protection of the present disclosure is not limited thereto, and the scope of protection of the present disclosure shall be subject to the scope of protection of the claims.

This application claims priority to Chinese Patent Application No. 201811075578.8 filed on Sep. 14, 2018, the disclosure of which is incorporated herein by reference in its entirety as part of this application.

What is claimed is:

1. An array substrate, comprising:
a base substrate;
an imaging array, arranged on the base substrate,
wherein the imaging array comprises a photoelectric detection circuit and a temperature detection circuit, the photoelectric detection circuit includes a photosensitive sensor configured to detect light for imaging, and the temperature detection circuit includes a temperature sensitive sensor configured to detect temperature.

2. The array substrate according to claim 1, wherein the temperature sensitive sensor is closer to the base substrate than the photosensitive sensor in a direction perpendicular to the base substrate.

3. The array substrate according to claim 2, wherein the temperature sensitive sensor and the photosensitive sensor overlap in the direction perpendicular to the base substrate.

4. The array substrate according to claim 1, wherein the temperature sensitive sensor comprises a temperature sensitive diode, the temperature sensitive diode comprises a PIN junction, and the PIN junction comprises a P-type semiconductor layer, an N-type semiconductor layer and an intrinsic layer,
the P-type semiconductor layer, the N-type semiconductor layer and the intrinsic layer are arranged side by side on the base substrate and are located on a same layer with respect to the base substrate.

5. The array substrate according to claim 4, further comprising a light shielding layer, wherein the light shielding layer is disposed at least on a side facing outside of the intrinsic layer and overlaps with the intrinsic layer.

6. The array substrate according to claim 5, wherein the temperature detection circuit further comprises a first transistor,
an active layer of the first transistor is located on a same layer as the PIN junction of the temperature sensitive diode.

7. The array substrate according to claim 6, wherein the light shielding layer is a metal layer located on a same layer as a gate of the first transistor, and a first insulating layer is disposed between the light shielding layer and the intrinsic layer.

8. The array substrate of claim 4, wherein the PIN junction further comprises:
a lightly doped layer, located between the N-type semiconductor layer or the P-type semiconductor layer and the intrinsic layer.

9. The array substrate according to claim 6, wherein the photosensitive sensor comprises a photodiode, the photodiode comprises a PIN junction, and the PIN junction comprises a P-type semiconductor layer, an intrinsic layer and an N-type semiconductor layer,
wherein the P-type semiconductor layer, the intrinsic layer and the N-type semiconductor are laminated on the base substrate,
wherein the photoelectric detection circuit further comprises a third transistor.

10. The array substrate according to claim 9, wherein an active layer of the third transistor, the PIN junction, and the active layer of the first transistor are located on a same layer.

11. The array substrate according to claim 9, further comprising:
a display array, including a display pixel circuit,
the display pixel circuit, including a second transistor and a light emitting element,
the photodiode includes a first electrode and a second electrode opposite to the first electrode, the first electrode of the photodiode is electrically connected with a first electrode of the third transistor,
the light emitting element comprises a first electrode and a second electrode opposite to the first electrode, the first electrode of the light emitting element is electrically connected with a first electrode of the second transistor through a connecting electrode,
the first electrode of the photodiode is located on a same layer as the connection electrode, and the second electrode of the photodiode is located on a same layer as the first electrode of the light emitting element.

12. The array substrate according to claim 11, wherein, the second electrode of the photodiode is electrically connected with a first voltage terminal,
a second electrode of the third transistor is electrically connected with a detection signal line, and a gate of the third transistor is electrically connected with a first scanning line,
the temperature sensitive diode comprises a first electrode and a second electrode, wherein the first electrode of the temperature sensitive diode is electrically connected with a first electrode of the first transistor, and the second electrode of the temperature sensitive diode is electrically connected with a second voltage terminal,
a second electrode of the first transistor is electrically connected to the detection signal line, and a gate of the first transistor is electrically connected to a second scanning line.

13. The array substrate according to claim 11, wherein the display array and the imaging array overlap each other, and the imaging array is disposed in an edge region on a side of the base substrate.

14. The array substrate according to claim 11, wherein, the second electrode of the photodiode is electrically connected with a first voltage terminal,
a second electrode of the third transistor is electrically connected with a first detection signal line, and a gate of the third transistor is electrically connected with a first scanning line,
the temperature sensitive diode comprises a first electrode and a second electrode, wherein the first electrode of the temperature sensitive diode is electrically connected with a first electrode of the first transistor, and the second electrode of the temperature sensitive diode is electrically connected with a second voltage terminal, a second electrode of the first transistor is electrically connected with a second detection signal line, and a gate of the first transistor is electrically connected with a second scanning line.

15. The array substrate according to claim 1, further comprising:

a processor, connected to the temperature detection circuit and the photoelectric detection circuit in a signal connection manner and configured to correct a detection result of the photoelectric detection circuit according to a detection result of the temperature detection circuit.

16. A display panel comprising the array substrate according to claim 1.

17. The display panel according to claim 16, further comprising:

a processor, connected to the temperature detection circuit and the photoelectric detection circuit in a signal connection manner and configured to correct a detection result of the photoelectric detection circuit according to a detection result of the temperature detection circuit.

18. An operation method of the display panel according to claim 16, comprising:

detecting light by using the photoelectric detection circuit to obtain a light detection result;

detecting temperature by using the temperature detection circuit to obtain a temperature detection result;

correcting the light detection result by the temperature detection result, wherein the corrected light detection structure is used for imaging.

19. The operating method according to claim 18, wherein the temperature detection circuit and the photoelectric detection circuit are connected to a same detection signal line, and wherein the detecting light by using the photoelectric detection circuit and the detecting temperature by using the temperature detection circuit are performed at different times using the detection signal line in a time division multiplexing manner.

20. The operating method according to claim 19, wherein the display panel further comprises:

a processor, connected in signal with the temperature detection circuit and the photoelectric detection circuit, the correcting the light detection result by the temperature detection result comprises:

the processor corrects the light detection result using the temperature detection result.

* * * * *